(12) United States Patent
Kinoshita

(10) Patent No.: US 11,169,215 B2
(45) Date of Patent: Nov. 9, 2021

(54) VEHICLE POWER SUPPLY APPARATUS

(71) Applicant: SUBARU CORPORATION, Tokyo (JP)

(72) Inventor: Takahiro Kinoshita, Tokyo (JP)

(73) Assignee: SUBARU CORPORATION, Tokyo (JP)

(*) Notice: Subject to any disclaimer, the term of this patent is extended or adjusted under 35 U.S.C. 154(b) by 215 days.

(21) Appl. No.: 16/439,365

(22) Filed: Jun. 12, 2019

(65) Prior Publication Data

US 2020/0003843 A1 Jan. 2, 2020

(30) Foreign Application Priority Data

Jun. 29, 2018 (JP) .............................. JP2018-123946

(51) Int. Cl.
| | |
|---|---|
| *G01R 31/3842* | (2019.01) |
| *G01R 19/165* | (2006.01) |
| *H02J 7/14* | (2006.01) |
| *F02N 11/08* | (2006.01) |
| *B60R 16/04* | (2006.01) |
| *H01M 10/48* | (2006.01) |

(Continued)

(52) U.S. Cl.
CPC .......... *G01R 31/3842* (2019.01); *B60R 16/04* (2013.01); *F02N 11/0825* (2013.01);
(Continued)

(58) Field of Classification Search
CPC .......... G01R 31/3842; G01R 19/16542; G01R 31/007; G01R 31/392; H01M 10/48; H01M 10/425; H01M 2220/20; G05D 1/0061; Y02E 60/10; Y02T 10/70; F02N 11/0866; F02N 11/0825; F02N 2200/061;
(Continued)

(56) References Cited

U.S. PATENT DOCUMENTS 10,017,176 B2 * 7/2018 Demmerle ............ B60W 20/50
10,913,356 B2 * 2/2021 Nakamura ................ H02J 1/08
(Continued)

FOREIGN PATENT DOCUMENTS

CN 101521299 A * 9/2009 ............. Y02E 60/10
EP 3354520 A1 * 8/2018 ............. B60L 3/0092
(Continued)

OTHER PUBLICATIONS

Japanese Notice of Reasons for Refusal issued in corresponding Japanese Patent Application No. 2018-123946, dated Mar. 17, 2020, with English translation.

*Primary Examiner* — M Baye Diao
(74) *Attorney, Agent, or Firm* — McDermott Will & Emery LLP

(57) ABSTRACT

A vehicle power supply apparatus includes first and second power supply systems, an accumulator sensor, and an abnormality determination unit. The first power supply system includes a generator and a first electrical energy accumulator. The second power supply system includes a second electrical energy accumulator and a group of electric devices. The accumulator sensor detects at least a discharge current of the second electrical energy accumulator. The abnormality determination unit determines that the second electrical energy accumulator is abnormal on the condition that the accumulator sensor is normal and the discharge current of the second electrical energy accumulator is equal to or smaller than a current threshold.

17 Claims, 13 Drawing Sheets

(51) Int. Cl.
  *H01M 10/42* (2006.01)
  *G05D 1/00* (2006.01)

(52) U.S. Cl.
  CPC ..... *G01R 19/16542* (2013.01); *G05D 1/0061* (2013.01); *H01M 10/425* (2013.01); *H01M 10/48* (2013.01); *H02J 7/14* (2013.01); *F02N 2200/061* (2013.01); *H01M 2220/20* (2013.01)

(58) Field of Classification Search
  CPC ...... B60R 16/03; B60R 16/04; H02J 2310/48; H02J 7/0013; H02J 7/0047; H02J 7/0031; H02J 7/14; B60L 50/15; B60L 58/10; B60L 3/0046
  USPC .......................................... 320/132; 307/10.1
  See application file for complete search history.

(56) References Cited

U.S. PATENT DOCUMENTS

| | | |
|---|---|---|
| 2007/0247106 A1 | 10/2007 | Kawahara et al. |
| 2015/0352968 A1 | 12/2015 | Date et al. |
| 2017/0297433 A1 | 10/2017 | Shibachi |
| 2019/0115175 A1 | 4/2019 | Saito |
| 2019/0252994 A1 * | 8/2019 | Kobayashi ................ B60L 1/00 |

FOREIGN PATENT DOCUMENTS

| | | | | |
|---|---|---|---|---|
| JP | 2004-147420 | A | 5/2004 | |
| JP | 2007-282375 | A | 10/2007 | |
| JP | 5317806 | B2 * | 10/2013 | .............. H02J 7/345 |
| JP | 2013-256174 | A | 12/2013 | |
| JP | 2013-256267 | A | 12/2013 | |
| JP | 2016-193632 | A | 11/2016 | |
| JP | 2017-073917 | A | 4/2017 | |
| JP | 2017-192236 | A | 10/2017 | |
| JP | 2017-218111 | A | 12/2017 | |
| JP | 2017218013 | A * | 12/2017 | ............... B60L 3/04 |
| JP | 2018-006252 | A | 1/2018 | |
| JP | 2018139462 | A * | 9/2018 | |
| WO | WO-2013080334 | A1 * | 6/2013 | ............ B60L 15/007 |
| WO | 2014/188541 | A1 | 11/2014 | |
| WO | WO-2017065161 | A1 * | 4/2017 | ............. B60R 16/02 |

* cited by examiner

VEHICLE POWER SUPPLY APPARATUS

CROSS-REFERENCE TO RELATED APPLICATIONS

This application claims priority from Japanese Patent Application No. 2018-123946 filed on Jun. 29, 2018, the entire contents of which are hereby incorporated by reference.

BACKGROUND

The technology relates to a vehicle power supply apparatus to be mounted on a vehicle.

Some vehicle power supply apparatuses to be mounted on vehicles include a generator to be driven by an engine, and an accumulator to be coupled to the generator. There are also proposals for power supply apparatuses that detect an abnormality in the accumulator, e.g., coming off of a terminal, from viewpoint of enhanced reliability of the power supply apparatuses. For example, reference can be made to Japanese Unexamined Patent Application Publication (JP-A) Nos. 2004-147420, 2013-256174, and 2017-218111. In detecting the abnormality such as the coming off of the terminal and disconnection, a determination as to presence or absence of the abnormality may be made on the basis of, for example, a terminal voltage of the accumulator.

SUMMARY

An aspect of the technology provides a vehicle power supply apparatus to be mounted on a vehicle that includes an engine. The vehicle power supply apparatus includes a first power supply system, a second power supply system, an accumulator sensor, and an abnormality determination unit. The first power supply system includes a generator and a first electrical energy accumulator. The generator is coupled to the engine. The first electrical energy accumulator is able to be coupled to the generator. The second power supply system includes a second electrical energy accumulator and a group of electric devices. The second electrical energy accumulator is coupled in parallel to the first electrical energy accumulator. The group of the electric devices is coupled to the second electrical energy accumulator.

The accumulator sensor is configured to detect at least a discharge current of the second electrical energy accumulator. The abnormality determination unit is configured to determine that the second electrical energy accumulator is abnormal on the condition that the accumulator sensor is normal and the discharge current of the second electrical energy accumulator is equal to or smaller than a current threshold.

An aspect of the technology provides a vehicle power supply apparatus to be mounted on a vehicle that includes an engine. The vehicle power supply apparatus includes a first power supply system, a second power supply system, an accumulator sensor, and circuitry. The first power supply system includes a generator and a first electrical energy accumulator. The generator is coupled to the engine. The first electrical energy accumulator is able to be coupled to the generator. The second power supply system includes a second electrical energy accumulator and a group of electric devices. The second electrical energy accumulator is coupled in parallel to the first electrical energy accumulator. The group of the electric devices is coupled to the second electrical energy accumulator. The accumulator sensor is configured to detect at least a discharge current of the second electrical energy accumulator. The circuitry is configured to determine that the second electrical energy accumulator is abnormal on a condition that the accumulator sensor is normal and the discharge current of the second electrical energy accumulator is equal to or smaller than a current threshold.

BRIEF DESCRIPTION OF THE DRAWINGS

The accompanying drawings are included to provide a further understanding of the technology and are incorporated in and constitute a part of this specification. The drawings illustrate example embodiment and, together with the specification, serve to explain the principles of the technology.

DETAILED DESCRIPTION

Figure 1:
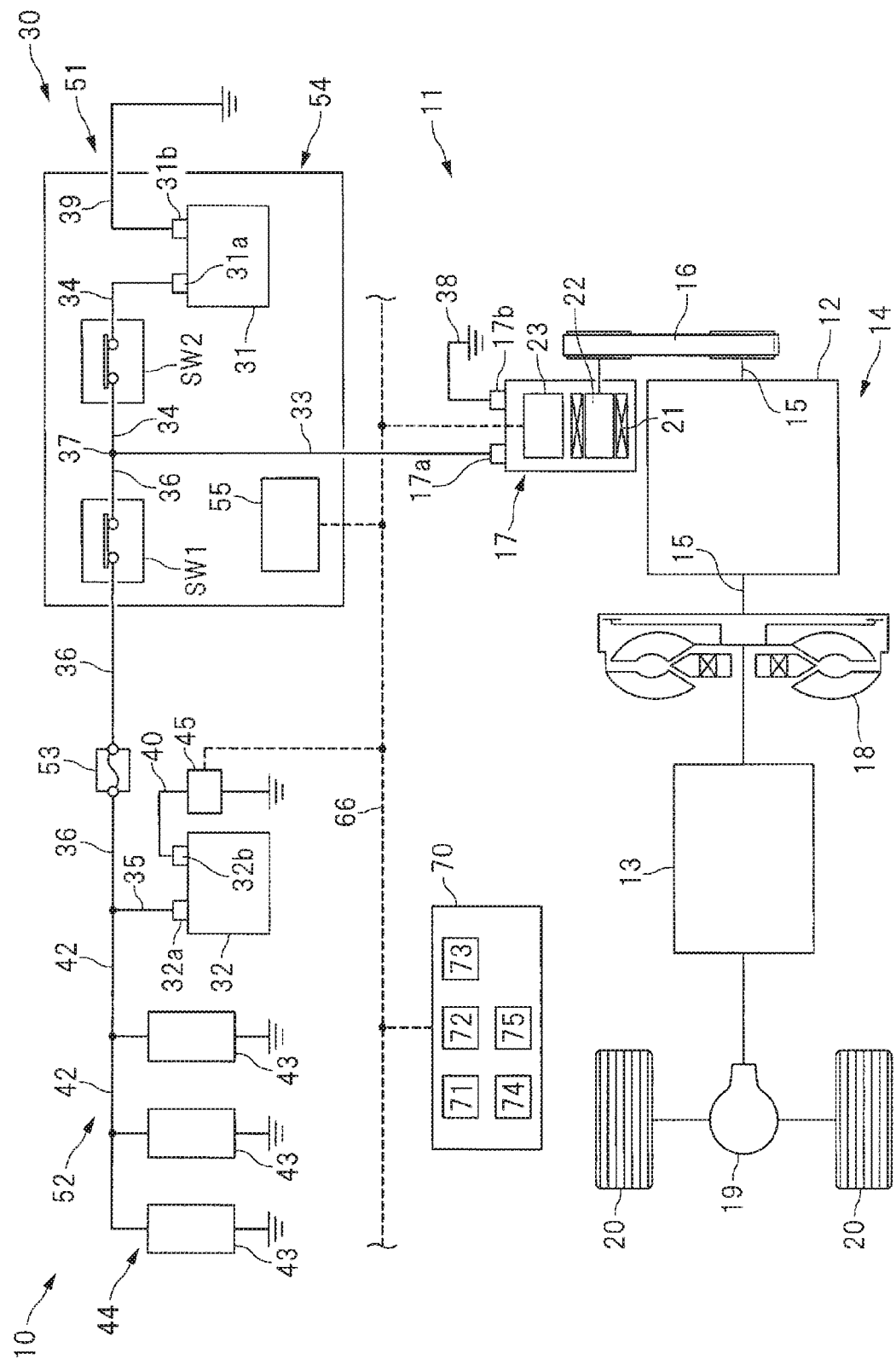
FIG. 1 is a schematic diagram of a configuration example of a vehicle on which a vehicle power supply apparatus according to one embodiment of the technology is mounted.

In the following, some preferred but non-limiting embodiments of the technology are described in detail with reference to the accompanying drawings. Note that sizes, materials, specific values, and any other factors illustrated in respective embodiments are illustrative for easier understanding of the technology, and are not intended to limit the scope of the technology unless otherwise specifically stated. Further, elements in the following example embodiments which are not recited in a most-generic independent claim of the technology are optional and may be provided on an as-needed basis. Throughout the specification and the drawings, elements having substantially the same function and configuration are denoted with the same reference numerals to avoid any redundant description. Further, elements that are not directly related to the technology are unillustrated in the drawings. The drawings are schematic and are not intended to be drawn to scale.

Some vehicle power supply apparatuses include a plurality of accumulators coupled in parallel to each other. Such vehicle power supply apparatuses may have difficulties in detecting an abnormality in any one of the accumulators on the basis of its terminal voltage. In other words, even in a case where one of the parallel-coupled accumulators has an abnormality such as coming off of a terminal, a voltage sensor detects a terminal voltage of the other of the parallel-coupled accumulators. This may cause possibility of an inadvertent determination that the relevant accumulator is normal regardless of the abnormality in the accumulator. What is desired is, therefore, to determine an abnormality in an accumulator by an alternative method.

It is desirable to provide a vehicle power supply apparatus that makes it possible to determine an abnormality in an electrical energy accumulator.

[Vehicle Configuration]

FIG. 1 schematically illustrates a configuration example of a vehicle 11 on which a vehicle power supply apparatus 10 according to one embodiment of the technology is mounted. Referring to FIG. 1, on the vehicle 11, a power unit 14 may be mounted. The power unit 14 may include, for example but not limited to, an engine 12 and a transmission mechanism 13. The engine 12 may include a crank shaft 15 to which a starter generator 17 is coupled through a belt mechanism 16. The transmission mechanism 13 may be also coupled to the engine 12 through a torque converter 18. One or more wheels 20 may be coupled to the transmission mechanism 13 through, for example but not limited to, a differential mechanism 19.

In one embodiment of the technology, the starter generator 17 may serve as a "generator" and a "generator motor".

The starter generator 17 coupled to the engine 12 may be a so-called integrated starter generator (ISG) that serves as a generator and an electric motor. Not only may the starter generator 17 serve as the generator driven by the crank shaft 15, the starter generator 17 may also serve as the electric motor that drives the crank shaft 15. For example, the starter generator 17 may serve as the electric motor, in a case of a restart of the engine 12 in an idling stop control, or in a case of assist drive of the engine 12 at the time of, for example, a start and acceleration.

The starter generator 17 may include a stator 21 and a rotor 22. The stator 21 may include a stator coil. The rotor 22 may include a field coil. The starter generator 17 may further include an ISG controller 23, in order to control energized states of the stator coil and the field coil. The ISG controller 23 may include an inverter, a regulator, and a microcomputer, without limitation. Allowing the ISG controller 23 to control the energized states of the field coil and the stator coil causes a control of, for example but not limited to, a power generation voltage, power generation torque, and powering torque of the starter generator 17.

[Power Circuit]

Figure 2:
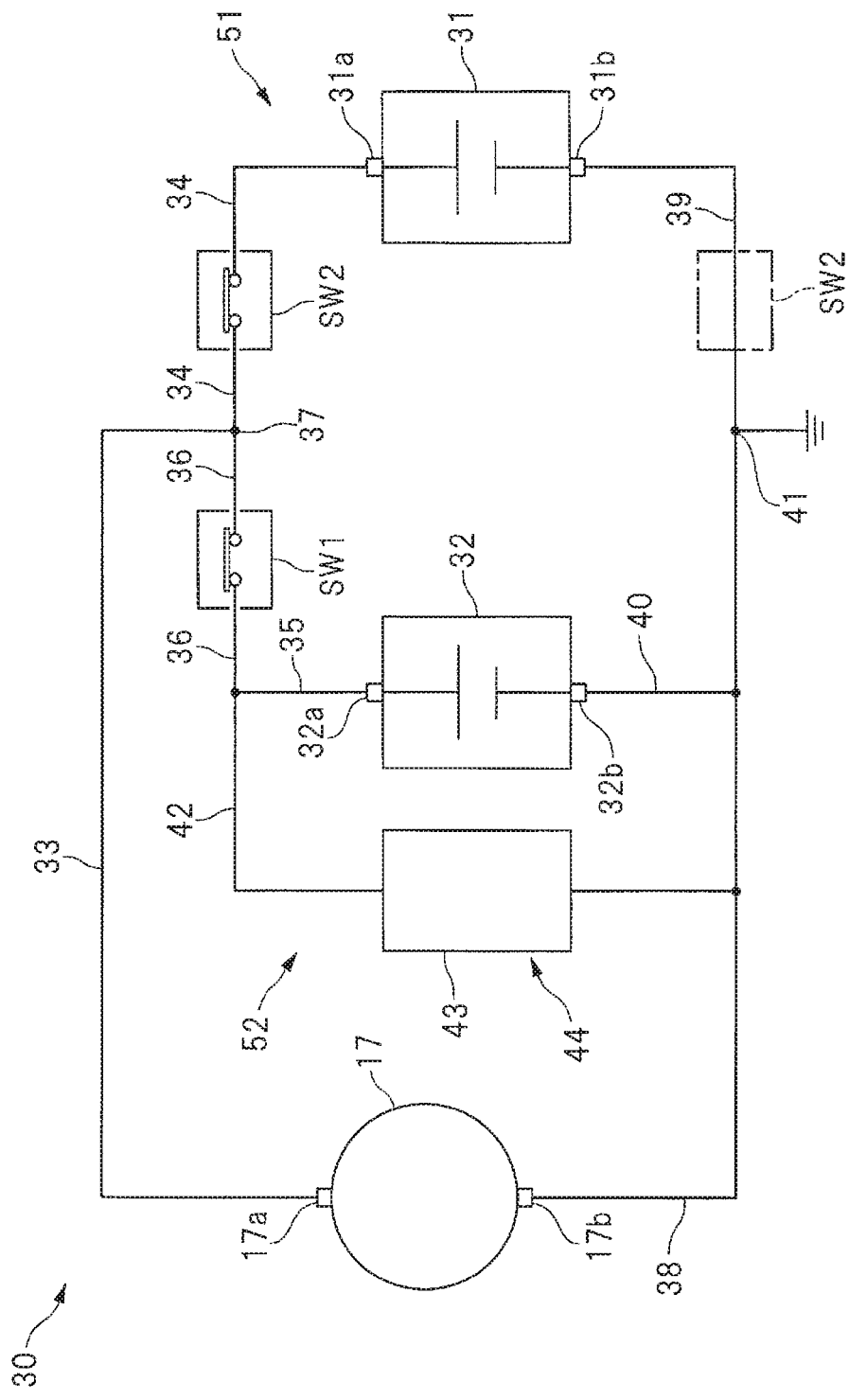
FIG. 2 is a circuit diagram of a simplified example of a power circuit.

The vehicle power supply apparatus 10 may include a power circuit 30, description of which is given below. FIG. 2 is a circuit diagram of a simplified example of the power circuit 30. Referring to FIG. 2, the power circuit 30 may include a lithium ion battery 31 and a lead battery 32. The lithium ion battery 31 may be electrically coupled to the starter generator 17. The lead battery 32 may be electrically coupled, in parallel with the lithium ion battery 31, to the starter generator 17. It is to be noted that a terminal voltage of the lithium ion battery 31 may be higher in design than a terminal voltage of the lead battery 32, in order to positively cause discharge of the lithium ion battery 31. Moreover, internal resistance of the lithium ion battery 31 may be lower in design than internal resistance of the lead battery 32, in order to positively cause charge and the discharge of the lithium ion battery 31.

In one embodiment of the technology, the lithium ion battery 31 may serve as a "first electrical energy accumulator". In one embodiment of the technology, the lead battery 32 may serve as a "second electrical energy accumulator".

A positive electrode line 33 may be coupled to a positive electrode terminal 17a of the starter generator 17. A positive electrode line 34 may be coupled to a positive electrode terminal 31a of the lithium ion battery 31. A positive electrode line 36 may be coupled to a positive electrode terminal 32a of the lead battery 32 through a positive electrode line 35. The positive electrode lines 33, 34, and 36 may be coupled to one another through a connection point 37. Moreover, a negative electrode line 38 may be coupled to a negative electrode terminal 17b of the starter generator 17. A negative electrode line 39 may be coupled to a negative electrode terminal 31b of the lithium ion battery 31. A negative electrode line 40 may be coupled to a negative electrode terminal 32b of the lead battery 32. The negative electrode lines 38, 39, and 40 may be coupled to one another through a reference potential point 41.

To the positive electrode line 35 of the lead battery 32, coupled may be a positive electrode line 42. To the positive electrode line 42, coupled may be a group of electric devices 44 including electric devices 43 such as various actuators and various controllers. Moreover, on the negative electrode line 40 of the lead battery 32, provided may be a battery sensor 45. The battery sensor 45 may have a function of detecting a charge state and a discharge state of the lead battery 32. Non-limiting examples of the charge state and the discharge state of the lead battery 32 may include a charge current, a discharge current, the terminal voltage, a state of charge of the lead battery 32. It is to be noted that the state of charge refers to a ratio of an amount of charged power to a designed capacity of a battery. In the example illustrated in the figures, the battery sensor 45 is provided on the negative electrode line 40 of the lead battery 32, but this is non-limiting. The battery sensor 45 may be provided on the positive electrode line 35 of the lead battery 32.

In one embodiment of the technology, the battery sensor 45 may serve as an "accumulator sensor".

The power circuit 30 may include a first power supply system 51 and a second power supply system 52. The first power supply system 51 includes the lithium ion battery 31 and the starter generator 17. The second power supply system 52 includes the lead battery 32 and the electric devices 43. The first power supply system 51 and the second power supply system 52 may be coupled to each other through the positive electrode line 36. On the positive electrode line 36, provided may be an electric power fuse 53 and a switch SW1. The electric power fuse 53 is configured to be melted down by an excessive current. The switch SW1 is configured to be controlled to an ON state and an OFF state. Moreover, on the positive electrode line 34 of the lithium ion battery 31, provided may be a switch SW2. The switch SW2 is configured to be controlled to an ON state and an OFF state.

In one embodiment of the technology, the switch SW1 may serve as a "switch". In one embodiment of the technology, the ON state of the switch SW1 may serve as a "turn-on state", and the OFF state of the switch SW1 may serve as a "turn-off state".

Controlling the switch SW1 to the ON state makes it possible to couple the first power supply system 51 and the second power supply system 52 to each other. Controlling the switch SW1 to the OFF state makes it possible to isolate the first power supply system 51 and the second power supply system 52 from each other. Moreover, controlling the switch SW2 to the ON state makes it possible to couple the lithium ion battery 31 to the starter generator 17. Controlling the switch SW2 to the OFF state makes it possible to isolate the lithium ion battery 31 from the starter generator 17.

The switches SW1 and SW2 may each be a switch including a semiconductor element such as a metal oxide semiconductor field effect transistor (MOSFET), or alternatively the switches SW1 and SW2 may each be a switch that causes a contact to mechanically open or close with the use of, for example but not limited to, electromagnetic force. The ON state of the switches SW1 and SW2 refers to an energized state that forms electrical coupling, or a conductive state. The OFF state of the switches SW1 and SW2 refers to a non-energized state that forms electrical isolation, or a cutoff state. It is to be noted that the switches SW1 and SW2 may be also referred to as, for example, a relay or a contactor.

As illustrated in FIG. 1, the power circuit 30 may include a battery module 54. The battery module 54 may include not only the lithium ion battery 31 but also the switches SW1 and SW2. The battery module 54 may further include a battery controller 55. The battery controller 55 may include, for example but not limited to, a microcomputer. The battery controller 55 may have a function of detecting, for example but not limited to, a state of charge SOC, a charge current, a discharge current, the terminal voltage, a cell temperature, and the internal resistance of the lithium ion battery 31. The battery controller 55 may also have a function of controlling the switches SW1 and SW2. It is to be noted that the state of charge SOC of the lithium ion battery 31 is hereinafter referred to as a "state of charge S_LiB".

[Control System]

Figure 3:
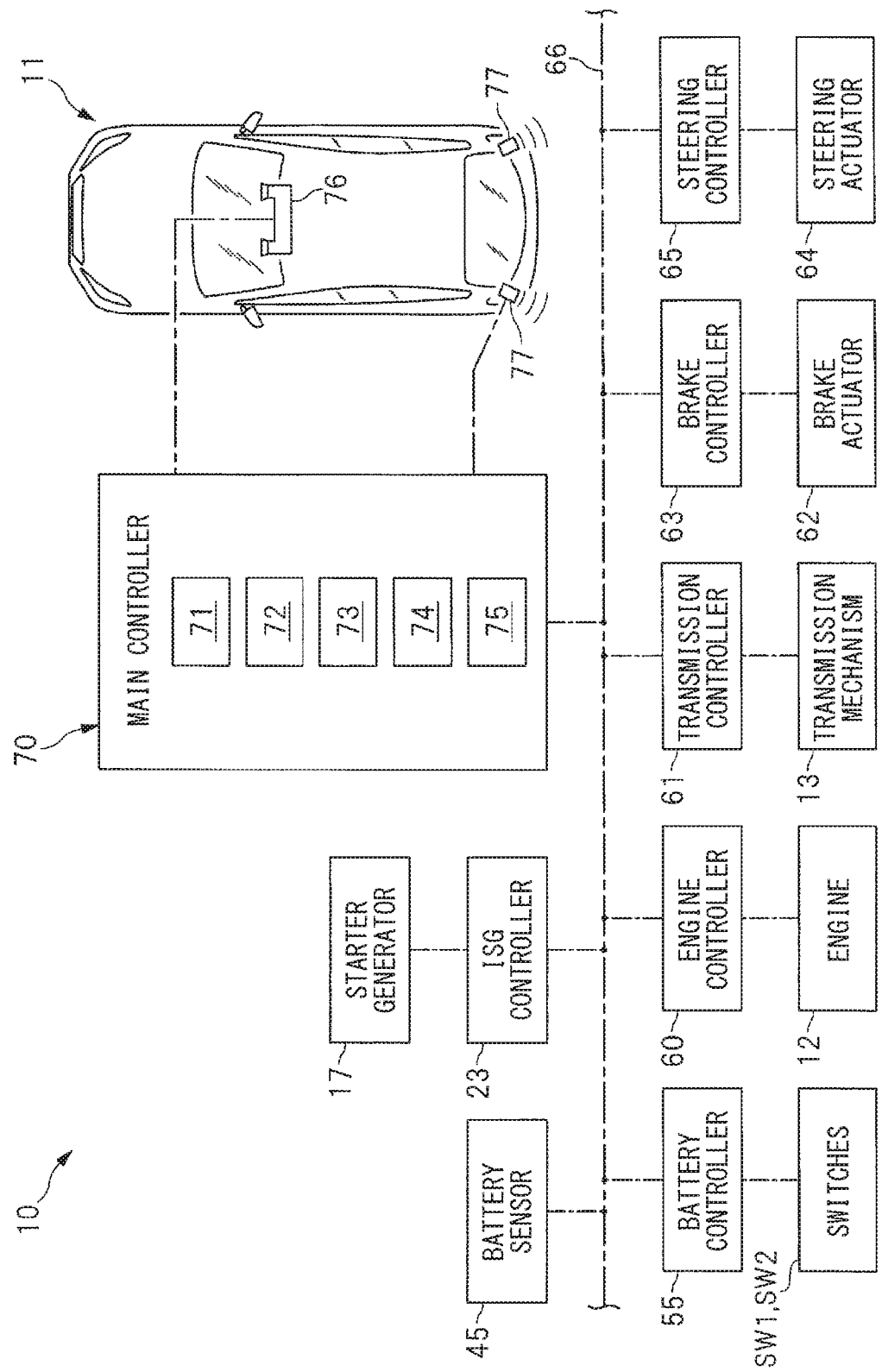
FIG. 3 is a block diagram of an example of a control system of the vehicle.

FIG. 3 is a block diagram of an example of a control system of the vehicle 11. Referring to FIG. 3, the vehicle 11 may include not only the ISG controller 23 and the battery controller 55 as mentioned above, but also an engine controller 60 and a transmission controller 61. The engine controller 60 may control an operation state of the engine 12. The transmission controller 61 may control an operation state of the transmission mechanism 13. The vehicle 11 may further include a brake controller 63 and a steering controller 65. The brake controller 63 may control a brake actuator 62 that adjusts brake power of the one or more wheels 20. The steering controller 65 may control a steering actuator 64 that adjusts steering angles of the one or more wheels 20. The vehicle 11 may further include a main controller 70. The main controller 70 may synthetically control the ISG controller 23, the battery controller 55, the engine controller 60, the transmission controller 61, the brake controller 63, and the steering controller 65. The ISG controller 23, the battery controller 55, the engine controller 60, the transmission controller 61, the brake controller 63, the steering controller 65, and the main controller 70 may each include, for example but not limited to, a microcomputer. The ISG controller 23, the battery controller 55, the engine controller 60, the transmission controller 61, the brake controller 63, the steering controller 65, and the main controller 70 may be communicatively coupled to one another through an on-vehicle network 66 such as a controller area network (CAN) and a local interconnect network (LIN).

The main controller 70 may constitute part of the vehicle power supply apparatus 10. The main controller 70 may have a function of controlling, for example but not limited to, the power unit 14 and the power circuit 30. The main controller 70 may include, for example but not limited to, an ISG control unit 71, a switch control unit 72, an idling control unit 73, and a driving control unit 74. The ISG control unit 71 may control the starter generator 17. The switch control unit 72 may control the switches SW1 and SW2. The idling control unit 73 may execute the idling stop control. The driving control unit 74 may execute an automated driving control.

In one embodiment of the technology, the ISG control unit 71 may serve as a "power generation controller" and an "assistance controller".

The ISG control unit 71 of the main controller 70 may supply a control signal to the ISG controller 23, to control the starter generator 17 to a powering state or a power generation state. The power generation state of the starter generator 17 may include a combustion power generation state and a regenerative power generation state described later. For example, the ISG control unit 71 may control the starter generator 17 to the powering state, in a case of a restart of the engine 12 in the idling stop control, or in a case of execution of an assistance control at the time of, for example, a start and acceleration. The assistance control includes providing assistance to the engine 12. Moreover, as described later, in a case where the state of charge S_LiB of the lithium ion battery 31 is low, the ISG control unit 71 may raise the power generation voltage of the starter generator 17, to control the starter generator 17 to the combustion power generation state. In a case where the state of charge S_LiB of the lithium ion battery 31 is high, the ISG control unit 71 may lower the power generation voltage of the starter generator 17, to control the starter generator 17 to a power generation suspended state.

The switch control unit 72 of the main controller 70 may supply a control signal to the battery controller 55, to switch the switches SW1 and SW2 to the ON state or the OFF state. For example, the switch control unit 72 may control both the switches SW1 and SW2 to the OFF state at an initial start of the engine 12 with the use of a starter motor as one of the electric devices 43, to provide the starter motor of the electric devices 43 with electric power supply from the lead battery 32. Moreover, after the initial start of the engine 12 by the starter motor, the switch control unit 72 may control the switch SW2 to the OFF state and control the switch SW1 to the ON state, to allow the starter generator 17 to make supplementary charge of the lead battery 32. At an end of the supplementary charge of the lead battery 32 after the initial start of the engine 12, the switch control unit 72 may control both the switches SW1 and SW2 to the ON state. Furthermore, as described later, at the time of a powering control of the starter generator 17, the switch control unit 72 may control the switch SW1 to the OFF state. It is to be noted that the switch control unit 72 may control the switch SW2 to the OFF state in a case with an abnormality in, for example, the lithium ion battery 31.

The idling control unit 73 of the main controller 70 may execute the idling stop control. The idling stop control includes automatically stopping and restarting the engine 12. The idling control unit 73 may execute, for example but not limited to, a fuel cut to stop the engine 12, in a case where a predetermined stop condition is satisfied while the engine 12 is in operation. The idling control unit 73 may bring the starter generator 17 to starting rotation to restart the engine 12, in a case where a predetermined start condition is satisfied while the engine 12 is stopped. Non-limiting examples of the stop condition of the engine 12 may include that a vehicle speed is lower than a predetermined value, with a brake pedal being stepped down. Non-limiting examples of the start condition of the engine 12 may include that stepping down of the brake pedal is released, and that stepping down of an accelerator pedal is started.

To the main controller 70, coupled may be, for example but not limited to, a front camera 76 and rear sideward radar 77. The front camera 76 may capture images frontward of the vehicle 11. The rear sideward radar 77 may detect obstacles rearward of the vehicle 11. The driving control unit 74 of the main controller 70 may make monitoring of situations of surroundings of the vehicle 11 on the basis of information from the front camera 76 and the rear sideward radar 77, while making an automatic control of steering, acceleration, and deceleration of the vehicle 11 in accordance with the situations of the surroundings of the vehicle 11. For example, the driving control unit 74 may supply a control signal to the controllers in accordance with the situations of the surroundings of the vehicle 11, to control the power unit 14, the brake actuator 62, and the steering actuator 64, without limitation. It is to be noted that the automated driving control to be executed by the main controller 70 may include a driver assistance control. The driver assistance control includes allowing the main controller 70 to make part of driving operations and part of monitoring of the surroundings. Specific but non-limiting examples of such a driver assistance control include an adaptive cruise control, a lane keeping control, and an automatic brake control. The adaptive cruise control includes making accelerated or decelerated travel while following a preceding vehicle. The lane keeping control includes steering the one or more wheels 20 so as not to let the vehicle 11 deviate from a traveling lane. The automatic brake control includes braking the one or more wheels 20 in a case where the vehicle 11 comes close to an obstacle frontward of the vehicle 11.

[Power Generation Control of Starter Generator]

Description is given next of a power generation control of the starter generator 17. The ISG control unit 71 of the main controller 70 may set a target power generation voltage of the starter generator 17 on the basis of the state of charge S_LiB of the lithium ion battery 31. The main controller 70 may supply the target power generation voltage to the ISG controller 23, to control the starter generator 17 to the combustion power generation state or the power generation suspended state described below.

Figure 4:
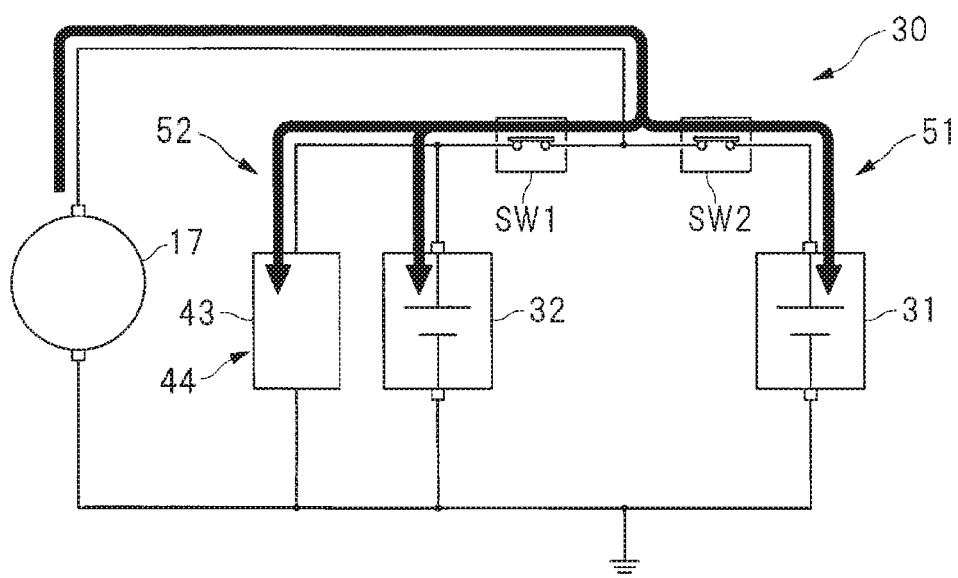
FIG. 4 is a diagram of an example of a situation as to how currents are supplied, with a starter generator controlled to a combustion power generation state.

FIG. 4 illustrates an example of a situation as to how currents are supplied, with the starter generator 17 controlled to the combustion power generation state. In one specific but non-limiting example, in a case where the state of charge S_LiB of the lithium ion battery 31 is lower than a predetermined power generation threshold, the starter generator 17 may be driven, by engine power, for power generation, in order to charge the lithium ion battery 31 and to increase the state of charge S_LiB. Thus, in controlling the starter generator 17 to the combustion power generation state, the power generation voltage of the starter generator 17 may be raised, causing the power generation voltage to be applied to the lithium ion battery 31 to be adjusted to a greater value than the terminal voltage. In this way, as denoted by black arrows in FIG. 4, currents may be supplied from the starter generator 17 to, for example, the lithium ion battery 31 and the lead battery 32, causing the lithium ion battery 31 and the lead battery 32 to be charged slowly.

Figure 5:
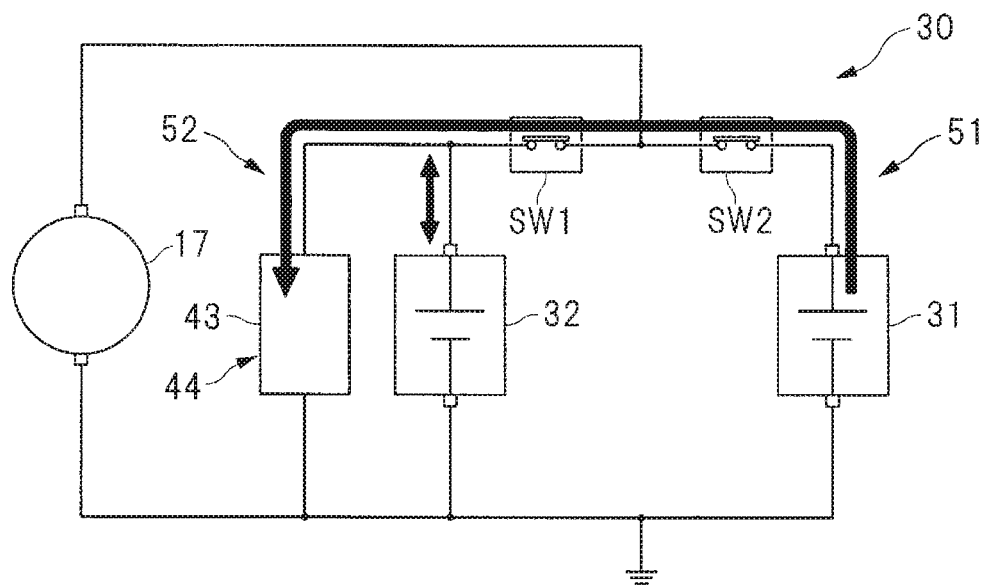
FIG. 5 is a diagram of an example of a situation as to how currents are supplied, with the starter generator controlled to a power generation suspended state.

FIG. 5 illustrates an example of a situation as to how currents are supplied, with the starter generator 17 controlled to the power generation suspended state. In one specific but non-limiting example, in a case where the state of charge S_LiB of the lithium ion battery 31 is higher than a predetermined suspension threshold, driving the starter generator 17, by the engine power, for the power generation may be stopped, in order to positively cause the discharge of the lithium ion battery 31. Thus, in controlling the starter generator 17 to the power generation suspended state, the power generation voltage of the starter generator 17 may be lowered, causing the power generation voltage to be applied to the lithium ion battery 31 to be adjusted to a smaller value than the terminal voltage. In this way, as denoted by black arrows in FIG. 5, a current may be supplied from the lithium ion battery 31 to the group of the electric devices 44. This makes it possible to suppress or stop the driving of the starter generator 17 for the power generation, leading to reduction in an engine load.

As mentioned above, the main controller 70 may control the starter generator 17 to the combustion power generation state or the power generation suspended state on the basis of the state of charge S_LiB. Meanwhile, at the time of deceleration of the vehicle 11, it is desirable to recover much kinetic energy to enhance fuel consumption performance. Therefore, at the time of the deceleration of the vehicle 11, the power generation voltage of the starter generator 17 may be raised considerably, causing the starter generator 17 to be controlled to the regenerative power generation state. This makes it possible to increase power-generated electric power, i.e., regenerative electric power, of the starter generator 17. It is therefore possible to positively convert the kinetic energy to electric energy and to recover the electric energy, leading to higher energy efficiency of the vehicle 11 and enhancement in the fuel consumption performance.

A determination as to whether or not to control the starter generator 17 to the regenerative power generation state as described above may be made on the basis of, for example but not limited to, operation states of the accelerator pedal and the brake pedal. For example, on decelerated travel with a release of the stepping down of the accelerator pedal, or on decelerated travel with the stepping down of the brake pedal, the starter generator 17 may be controlled to the regenerative power generation state because the situation is that the engine 12 is controlled to a fuel cut state. On accelerated travel with the stepping down of the accelerator pedal, or on steady travel, the starter generator 17 may be controlled to the combustion power generation state or the power generation suspended state because the situation is that the engine 12 is controlled to a fuel injection state.

Figure 6:
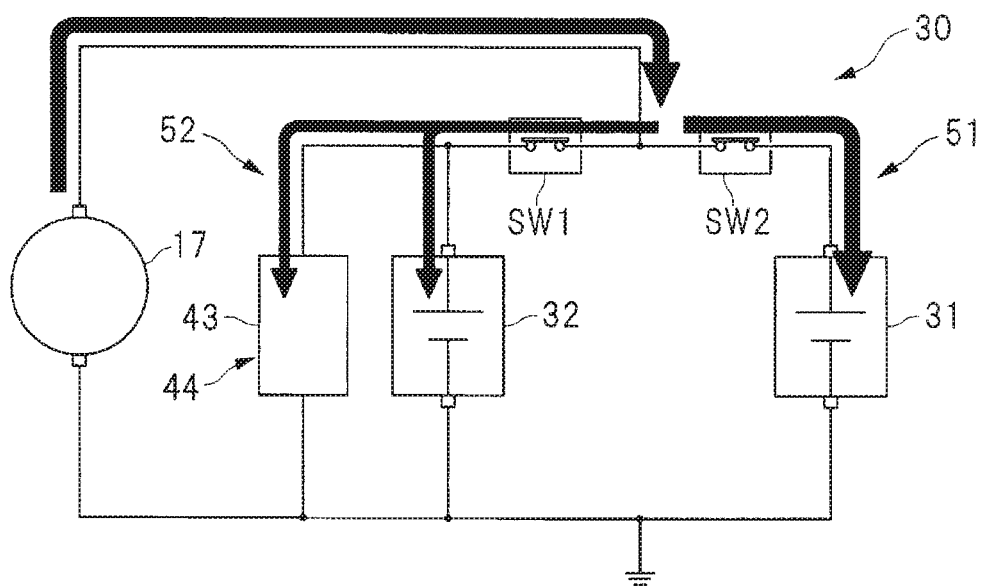
FIG. 6 is a diagram of an example of a situation as to how currents are supplied, with the starter generator controlled to a regenerative power generation state.

FIG. 6 illustrates an example of a situation as to how currents are supplied, with the starter generator 17 controlled to the regenerative power generation state. In controlling the starter generator 17 to the regenerative power generation state, the power generation voltage of the starter generator 17 may be raised to a greater value than in the combustion power generation state as mentioned above, causing the power generation voltage to be applied to the lithium ion battery 31 to be brought to a considerably greater value than the terminal voltage. This causes large current supply from the starter generator 17 to the lithium ion battery 31 and the lead battery 32, as denoted by black arrows in FIG. 6, resulting in rapid charge of the lithium ion battery 31 and the lead battery 32. Moreover, because the internal resistance of the lithium ion battery 31 is smaller than the internal resistance of the lead battery 32, most of the power-generated current is supplied to the lithium ion battery 31.

It is to be noted that as illustrated in FIGS. 4 to 6, in controlling the starter generator 17 to the combustion power generation state, the regenerative power generation state, and the power generation suspended state, the switches SW1 and SW2 may be kept in the ON state. In other words, in the vehicle power supply apparatus 10, it is possible to control the charge and the discharge of the lithium ion battery 31 solely by controlling the power generation voltage of the starter generator 17 without making a switching control of the switches SW1 and SW2. Hence, it is possible to easily control the charge and the discharge of the lithium ion battery 31, and to enhance durability of the switches SW1 and SW2.

Figure 7:
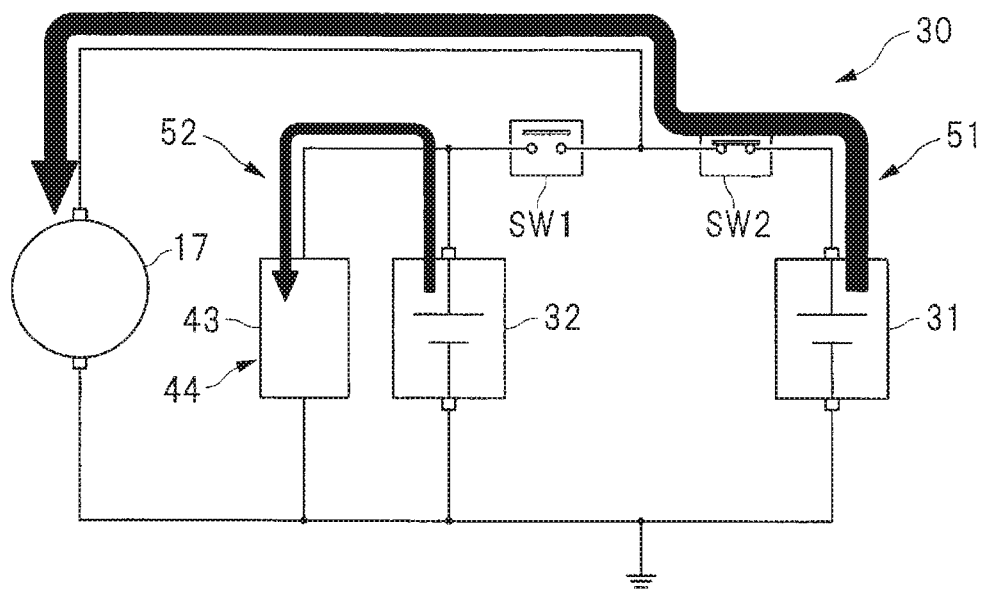
FIG. 7 is a diagram of an example of a situation as to how currents are supplied, with the starter generator controlled to a powering state.

FIG. 7 illustrates an example of a situation as to how currents are supplied, with the starter generator 17 controlled to the powering state. As illustrated in FIG. 7, in controlling the starter generator 17 to the powering state, the switch SW1 may be switched from the ON state to the OFF state. In other words, in allowing the starter generator 17 to bring the engine 12 to the starting rotation, or in the assist drive of the engine 12 by the starter generator 17, the switch SW1 may be switched from the ON state to the OFF state. This causes the isolation of the first power supply system 51 and the second power supply system 52 from each other, making it possible to prevent an instantaneous voltage drop with respect to the group of the electric devices 44 even in a case with large current supply from the lithium ion battery 31 to the starter generator 17. It is therefore possible to allow the group of the electric devices 44 to function normally.

[Abnormal State of Lead Battery]

Figure 8:
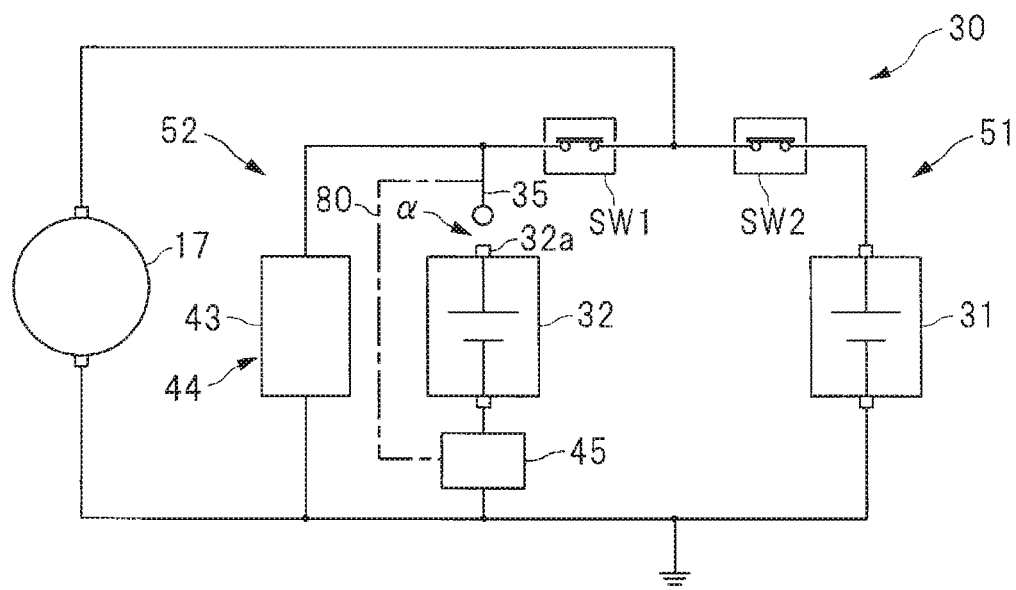
FIG. 8 is a diagram of an example of an abnormality in a lead battery.

Described next is an abnormal state of the lead battery 32. FIG. 8 illustrates an example of the abnormal state of the lead battery 32. First, as illustrated in FIG. 7 as mentioned above, in controlling the starter generator 17 to the powering state, the switch SW1 may be switched to the OFF state. Even in this case, the group of the electric devices 44 is provided with current supply from the lead battery 32, making it possible to allow the group of the electric devices 44 to function normally. However, as denoted by an arrow a in FIG. 8, in a case with an abnormality in the lead battery 32, e.g., coming off of a terminal, it is impracticable to provide the group of the electric devices 44 with the current supply from the lead battery 32. It is therefore desirable to inhibit, for example, the switch SW1 from being switched to the OFF state.

A possible method to detect the abnormality in the lead battery 32, e.g., the coming off of the terminal, may be to detect the terminal voltage of the lead battery 32 with the use of the battery sensor 45. However, as illustrated in FIG. 8, in a case where a potential detection line 80 of the battery sensor 45 is coupled to, for example, the positive electrode line 35, it is difficult to detect appropriately the terminal voltage of the lead battery 32. In other words, even in a case where the positive electrode line 35 comes off the positive electrode terminal 32a of the lead battery 32, a positive electrode potential of the lithium ion battery 31 is applied to the positive electrode line 35. This causes the battery sensor 45 to detect the terminal voltage of the lead battery 32 equivalent to that in a normal state. Accordingly, in the power circuit 30 in which the lead battery 32 and the lithium ion battery 31 are coupled in parallel, it has been difficult to detect the abnormality, e.g., the coming off of the terminal and disconnection, on the basis of the terminal voltage of the lead battery 32 to be detected by the battery sensor 45.

Thus, as illustrated in FIG. 3, the main controller 70 includes an abnormality determination unit 75 that determines whether or not the lead battery 32 has the abnormality such as the coming off of the terminal. As described later, the abnormality determination unit 75 of the main controller 70 determines whether or not the lead battery 32 has the abnormality such as the coming off of the terminal, on the basis of a discharge current i_PbB to be transmitted from the battery sensor 45.

[Abnormality Determination of Lead Battery]

Figure 9:
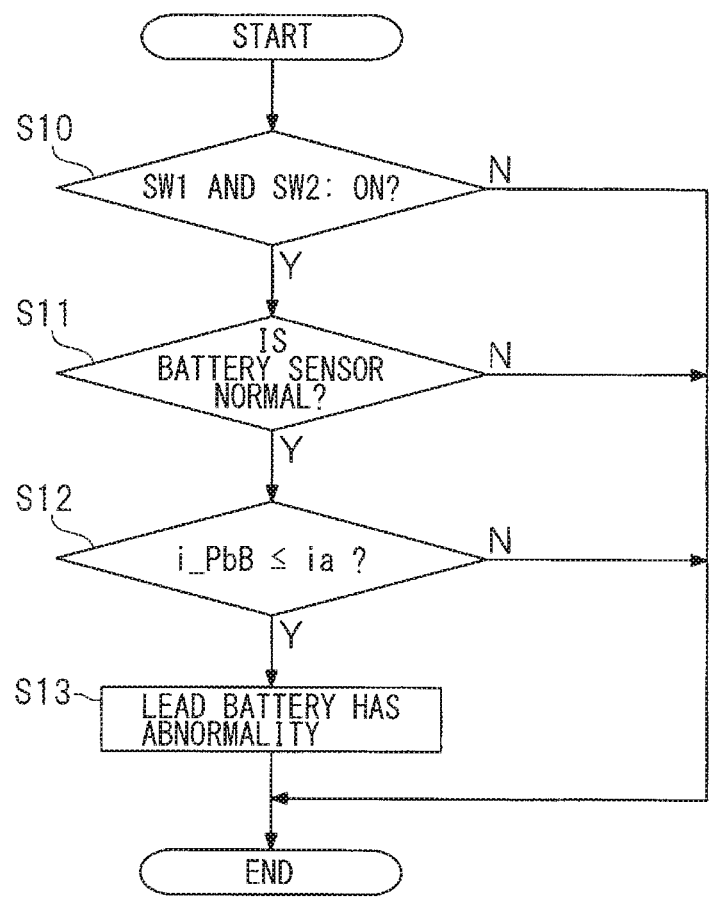
FIG. 9 is a flowchart of an example of an execution procedure of abnormality determination processing.

Described is abnormality determination processing that includes determining presence or absence of the abnormality in the lead battery 32. The abnormality determination processing may be executed by the main controller 70 on predetermined cycles. FIG. 9 is a flowchart of an example of an execution procedure of the abnormality determination processing.

As illustrated in FIG. 9, in step S10, a determination may be made as to whether or not the switches SW1 and SW2 are both in the ON state. In step S10, in a case where a determination is made that the switches SW1 and SW2 are both in the ON state (Y in step S10), i.e., in a case where the lithium ion battery 31 and the lead battery 32 are coupled in parallel, the flow may proceed to step S11. In step S11, a determination may be made as to whether or not the battery sensor 45 is normal.

In step S11, in a case where a determination is made that the battery sensor 45 is normal (Y in step S11), i.e., in a case where, for example but not limited to, the discharge current of the lead battery 32 is detected normally, the flow may proceed to step S12. In step S12, a determination may be made as to whether or not the discharge current i_PbB of the lead battery 32 is equal to or smaller than a predetermined current threshold ia. The current threshold ia is a current value smaller than a minimum value of the discharge current of the lead battery 32 in a normal state. In other words, the current threshold ia is a current value set at a smaller value than a current value to be discharged from the lead battery 32, with the group of the electric devices 44 stopped. For example, the current threshold ia may be set at 0 (zero) V, or alternatively, the current threshold ia may be set at a current value near 0 (zero) V, e.g., 100 mA.

In other words, in step S12, the situation that the discharge current i_PbB is equal to or smaller than the current threshold ia is that no current flows from the lead battery 32 to the group of the electric devices 44, i.e., that the lead battery 32 is isolated from the power circuit 30. Accordingly, in step S12, in the case where the discharge current i_PbB is equal to or smaller than the current threshold ia (Y in step S12), the flow may proceed to step S13. In step S13, a determination may be made that the lead battery 32 has the abnormality, e.g., the coming off of the terminal or the disconnection, or both.

As described, the determination as to the presence or the absence of the abnormality is made on the basis of the discharge current i_PbB of the lead battery 32. Hence, it is possible to appropriately detect the abnormality in the lead battery 32 even in the case where the lithium ion battery 31 and the lead battery 32 are coupled in parallel. It is to be noted that in step S10, in a case where a determination is made that the switch SW1 or the switch SW2, or both are in the OFF state (N in step S10), the flow may be terminated without making the abnormality determination of the lead battery 32 (step S13). This may also apply to a case where in step S11, a determination is made that the battery sensor 45 is abnormal (N in step S11), and to a case where in step S12, a determination is made that the discharge current i_PbB of the lead battery 32 is greater than the current threshold is (N in step S12).

It is to be noted that the battery sensor 45 may have a self-diagnosis function, that is, a function of making a self-diagnosis of a sensor abnormality. In a case where the battery sensor 45 is abnormal, i.e., in a case where the battery sensor 45 fails to normally detect, for example, the discharge current, the charge current, and the terminal voltage of the lead battery 32, the battery sensor 45 may transmit an abnormality signal to the main controller 70. Receiving the abnormality signal from the battery sensor 45, the abnormality determination unit 75 of the main controller 70 may make a determination that the battery sensor 45 has the abnormality. The determination that the battery sensor 45 has the abnormality may be also made in a case where the abnormality determination unit 75 of the main controller 70 fails in normally receiving, from the battery sensor 45, a signal indicating, for example, the discharge current.

[Fail-Safe Operation in a Case with Lead Battery Abnormality]

Figure 10:
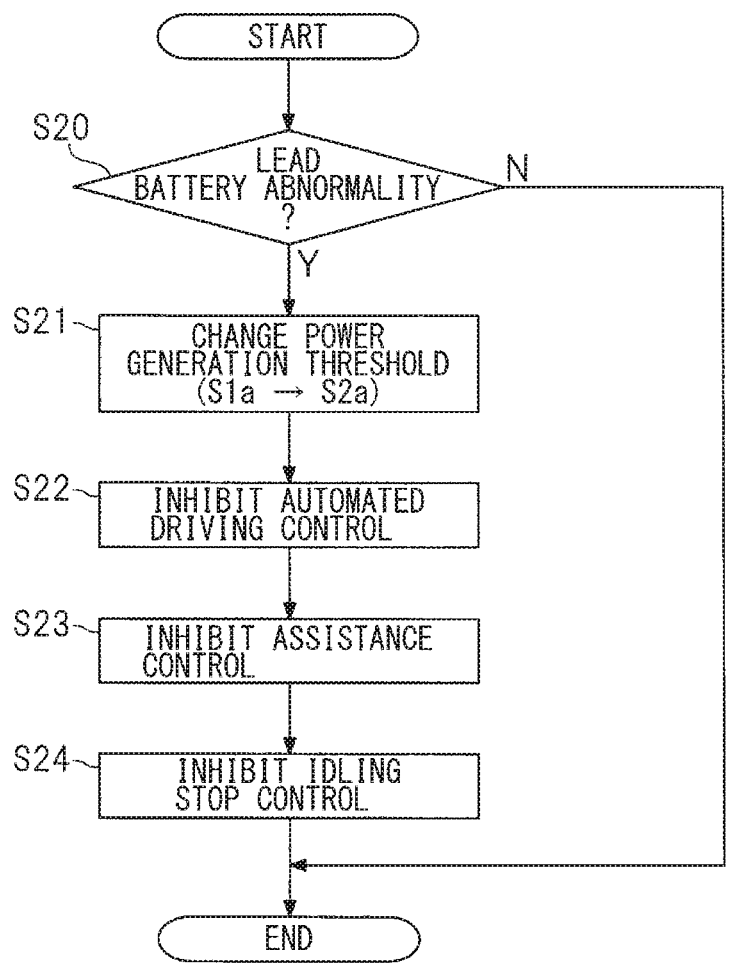
FIG. 10 is a flowchart of an example of an execution procedure of a fail-safe control.

Described is fail-safe processing in a case where the lead battery 32 has the abnormality. The fail-safe processing may be executed by the main controller 70 on predetermined cycles. FIG. 10 is a flowchart of an example of an execution procedure of the fail-safe processing.

Referring to FIG. 10, in step S20, a determination may be made as to whether or not the lead battery 32 has the abnormality. In a case where a determination is made that the lead battery 32 is abnormal (Y in step S20), the flow may proceed to step S21. In step S21, the power generation threshold may be raised from a power generation threshold S1a to a power generation threshold S2a. The power generation threshold serves as an execution criteria for controlling the starter generator 17 to the combustion power generation state. This makes it possible to allow the lithium ion battery 31 to accumulate much electric power. Hence, it is possible to stabilize a power supply voltage to be applied to the group of the electric devices 44 even in a case where the lead battery 32 comes off the power circuit 30.

In one embodiment of the technology, the power generation threshold S1a may serve as a "first power generation threshold". In one embodiment of the technology, the power generation threshold S2a may serve as a "second power generation threshold".

Moreover, in step S20, in the case where the determination is made that the lead battery 32 is abnormal (Y in step S20), the flow may proceed to step S22. In step S22, the automated driving control of the vehicle 11 may be inhibited. In other words, in the case where the lead battery 32 comes off the power circuit 30, there is possibility that the power supply voltage of the group of the electric devices 44 becomes unstable. Accordingly, the automated driving control such as the adaptive cruise control may be inhibited. This makes it possible to enhance reliability of the vehicle 11.

Furthermore, in step S20, in the case where the determination is made that the lead battery 32 is abnormal (Y in step S20), the flow may proceed to step S23 in which the assistance control by the starter generator 17 may be inhibited. Thereafter, the flow may proceed to step S24 in which the idling stop control may be inhibited. In other words, in the case where the lead battery 32 comes off the power circuit 30, it is impracticable to control the switch SW1 to the OFF state. Accordingly, the assistance control and the idling stop control that are accompanied by the powering of the starter generator 17 may be inhibited. This makes it possible to enhance the reliability of the vehicle 11.

(Change of Power Generation Threshold)

In the following, described are details as to how the power generation threshold is changed in step S21. First, as illustrated in FIG. 4, in a case where the state of charge S_LiB of the lithium ion battery 31 lowers, the starter generator 17 may be switched to the combustion power generation state. In the combustion power generation state of the starter generator 17, the power generation voltage may be raised to the greater value than the terminal voltage of the lithium ion battery 31, causing the charge of the lithium ion battery 31. Whereas, as illustrated in FIG. 5, in the case where the state of charge S_LiB of the lithium ion battery 31 increases, the starter generator 17 may be switched to the power generation suspended state. In the power generation suspended state of the starter generator 17, the power generation voltage may be lowered to the smaller value than the terminal voltage of the lithium ion battery 31, to prompt the discharge of the lithium ion battery 31.

Figure 11:
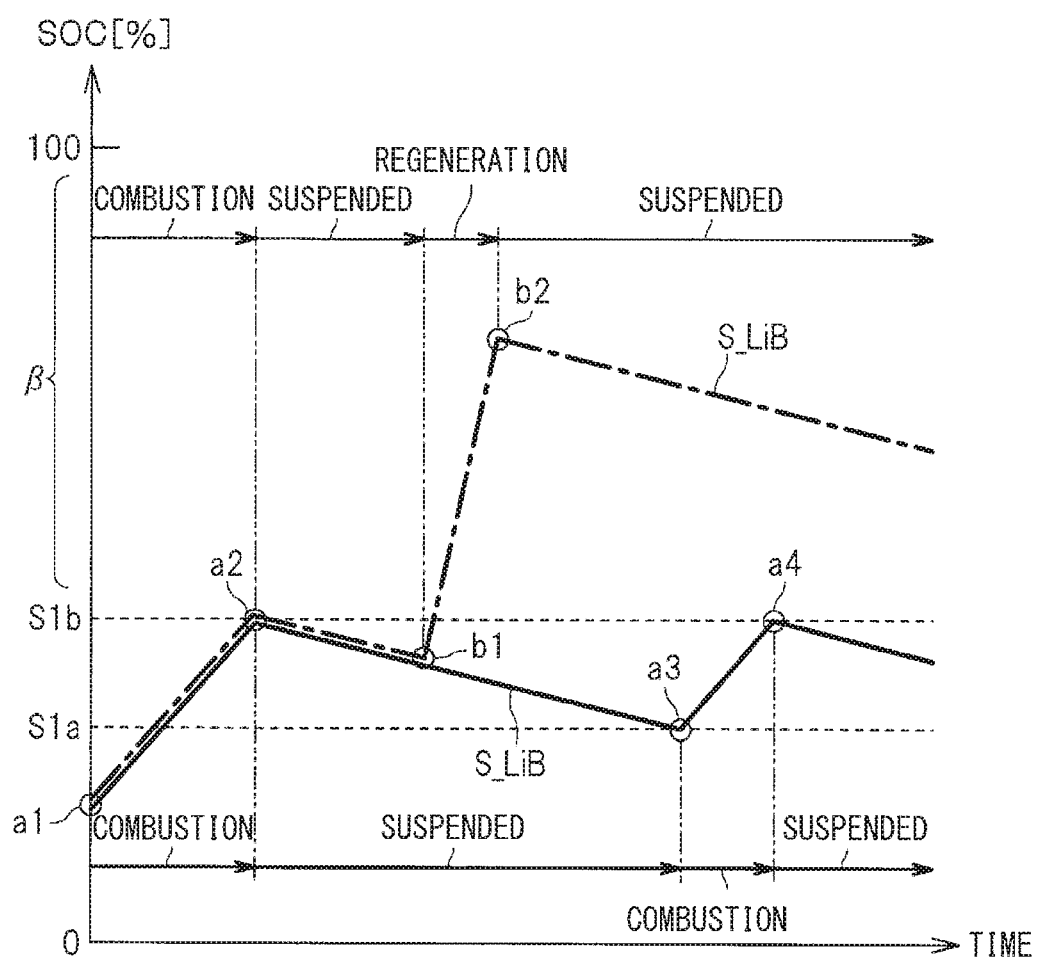
FIG. 11 is a diagram of examples of a power generation threshold and a suspension threshold to be set in a case where the lead battery is normal.
Figure 12:
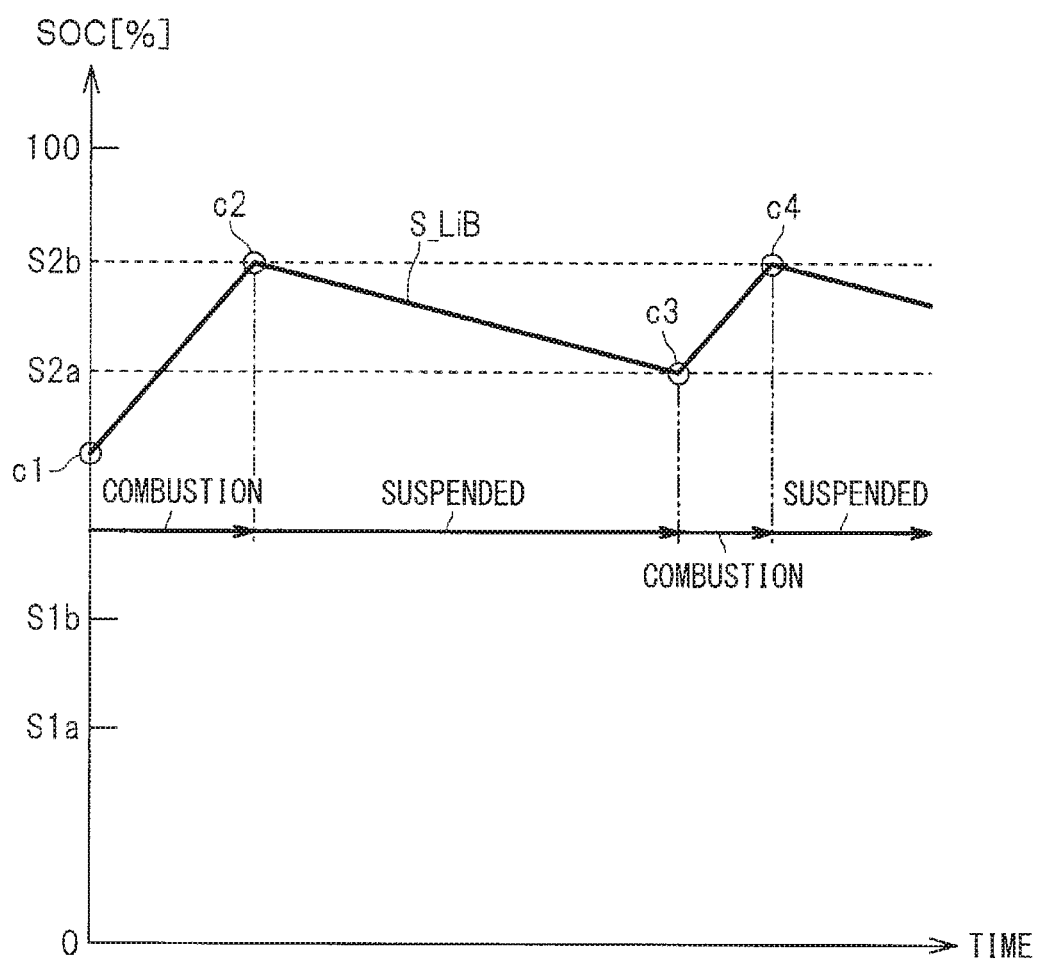
FIG. 12 is a diagram of examples of a power generation threshold and a suspension threshold to be set in a case where the lead battery is abnormal.

As described, in order to switch the starter generator 17 to the combustion power generation state and the power generation suspended state on the basis of the state of charge S_LiB of the lithium ion battery 31, the power generation thresholds S1a and S2a, and suspension thresholds S1b and S2b may be set. The power generation thresholds S1a and S2a, and the suspension thresholds S1b and S2b may be provided for comparison with the state of charge S_LiB. FIG. 11 illustrates examples of the power generation threshold S1a and the suspension threshold S1b that are set in the case where the lead battery 32 is normal. FIG. 12 illustrates examples of the power generation threshold S2a and the suspension threshold S2b that are set in the case where the lead battery 32 is abnormal.

As denoted by reference characters a1 in FIG. 11, in the case where the state of charge S_LiB of the lithium ion battery 31 is lower than the predetermined power generation threshold S1a, the starter generator 17 may be controlled to the combustion power generation state. The state of charge S_LiB of the lithium ion battery 31 increases by the charge of the lithium ion battery 31, to reach the predetermined suspension threshold S1b (reference characters a2), and thereupon, the starter generator 17 may be controlled to the power generation suspended state. The state of charge S_LiB of the lithium ion battery 31 lowers by the discharge of the lithium ion battery 31, to reach the power generation threshold S1a (reference characters a3), and thereupon, the starter generator 17 may be controlled again to the combustion power generation state. Thereafter, the state of charge S_LiB of the lithium ion battery 31 reaches the suspension threshold S1b (reference characters a4), and thereupon, the starter generator 17 may be controlled again to the power generation suspended state.

As described, in the case where the lead battery 32 is normal, the power generation threshold S1a and the suspension threshold S1b may be set at small values. This makes it possible to keep relatively low the state of charge S_LiB of the lithium ion battery 31. Hence, it is possible to provide sufficient vacant capacity β of the lithium ion battery 31, and to control the starter generator 17 to the regenerative power generation state on the decelerated travel, without missing a regeneration opportunity. In other words, as denoted by reference characters b1 to b2 in FIG. 11, it is possible to control the starter generator 17 to the regenerative power generation state without missing the regeneration opportunity. Hence, it is possible to obtain much regenerative electric power, leading to enhancement in energy efficiency of the vehicle 11.

In contrast, as illustrated in FIG. 12, in the case where the lead battery 32 is abnormal, the power generation threshold S2a and the suspension threshold S2b may be set at greater values than in the case where the lead battery 32 is normal. In other words, the power generation threshold S1a may be set in the case where the lead battery 32 is normal, whereas the power generation threshold S2a larger than the power generation threshold S1a may be set in the case where the lead battery 32 is abnormal. Likewise, the suspension threshold S1b may be set in the case where the lead battery 32 is normal, whereas the suspension threshold S2b greater than the suspension threshold S1b may be set in the case where the lead battery 32 is abnormal.

Accordingly, in the case where the lead battery 32 is abnormal, as denoted by reference characters c1 in FIG. 12, the state of charge S_LiB of the lithium ion battery 31 becomes lower than the power generation threshold S2a, and thereupon, the starter generator 17 may be controlled to the combustion power generation state. The state of charge S_LiB of the lithium ion battery 31 increases by the charge of the lithium ion battery 31, to reach the predetermined suspension threshold S2b (reference characters c2), and thereupon, the starter generator 17 may be controlled to the power generation suspended state. The state of charge S_LiB of the lithium ion battery 31 lowers by the discharge of the lithium ion battery 31, to reach the power generation threshold S2a (reference characters c3), and thereupon, the starter generator 17 may be controlled again to the combustion power generation state. Thereafter, the state of charge S_LiB of the lithium ion battery 31 reaches the suspension threshold S2b (reference characters c4), and thereupon, the starter generator 17 may be controlled again to the power generation suspended state.

As described, the power generation threshold S2a in the case where the lead battery 32 has the abnormality may be set at the greater value than the power generation threshold S1a in the case where the lead battery 32 is normal. This makes it possible to keep relatively high the state of charge S_LiB of the lithium ion battery 31. Hence, it is possible to allow the lithium ion battery 31 to accumulate much electric power. This makes it possible to stabilize the power supply voltage to be applied to the group of the electric devices 44 even in the case where the lead battery 32 comes off the power circuit 30. Hence, it is possible to allow the group of the electric devices 44 to function normally, leading to enhanced reliability of the vehicle 11.

(Inhibition of Power Generation Suspended State)

Figure 13:
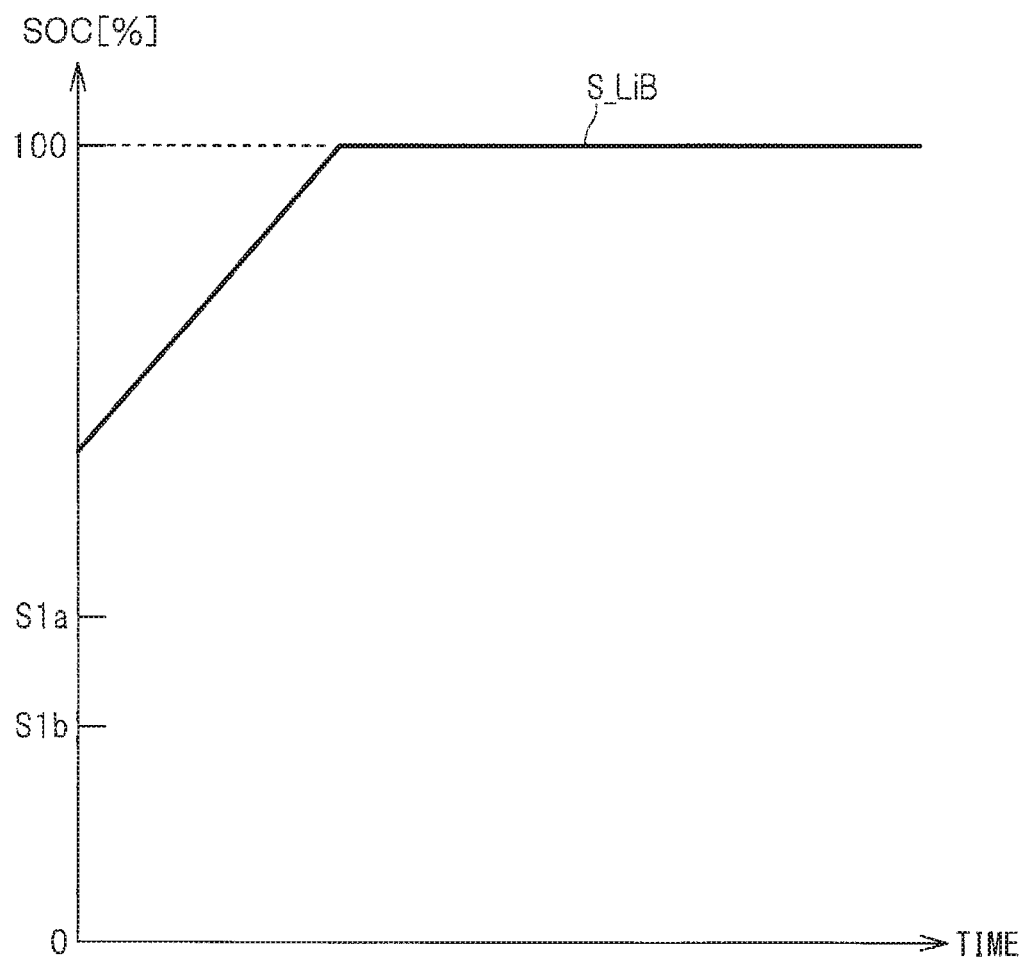
FIG. 13 is a diagram of an example of transitions of a state of charge in the case where the lead battery is abnormal.

FIG. 13 illustrates an example of transitions of the state of charge S_LiB in the case where the lead battery 32 is abnormal. In the forgoing example illustrated in FIG. 12, in the case where the lead battery 32 is abnormal, the power generation threshold S2a and the suspension threshold S2b may be set at the greater values than in the case where the lead battery 32 is normal, to suppress the starter generator 17 from being controlled to the power generation suspended state. However, this is non-limiting. For example, in the case where the determination is made that the lead battery 32 has the abnormality, the power generation suspended state of the starter generator 17 may be inhibited. In this case, it follows that the starter generator 17 is kept in the combustion power generation state. In other words, the starter generator 17 is kept driven, by the engine power, for the power generation. Accordingly, as illustrated in FIG. 13, the state of charge S_LiB of the lithium ion battery 31 makes transitions at and near 100%.

As described, in the case where the lead battery 32 is normal, the power generation suspended state of the starter generator 17 may be permitted, whereas in the case where the lead battery 32 is abnormal, the power generation suspended state may be inhibited. Thus, inhibiting the power generation suspended state of the starter generator 17 in the case where the determination is made that the lead battery 32 is abnormal also makes it possible to allow the lithium ion battery 31 to accumulate much electric power. This makes it possible to stabilize the power supply voltage to be applied to the group of the electric devices 44 even in the case where the lead battery 32 comes off the power circuit 30. Hence, it is possible to allow the group of the electric devices 44 to function normally, leading to the enhanced reliability of the vehicle 11.

Although some preferred embodiments of the technology are described above by way of example with reference to the accompanying drawings, the technology is by no means limited to the embodiments described above. It should be appreciated that modifications and alterations may be made by persons skilled in the art without departing from the scope as defined by the appended claims. In the forgoing example embodiments, the power circuit 30 includes the switches SW1 and SW2, but this is non-limiting. The switch SW1 may be eliminated from the power circuit 30, or alternatively, the switch SW2 may be eliminated from the power circuit 30. Furthermore, in the forgoing example embodiments, the switch SW2 is provided on the positive electrode line 34 of the lithium ion battery 31, but this is non-limiting. For example, as denoted by an alternate long and short dashed line in FIG. 2, the switch SW2 may be provided on the negative electrode line 39 of the lithium ion battery 31.

In the forgoing example embodiments, the lithium ion battery 31 may serve as the "first electrical energy accumulator", and the lead battery 32 may serve as the "second electrical energy accumulator". However, this is non-limiting. Other kinds of batteries or capacitors may be adopted. Moreover, the "first electrical energy accumulator" and the "second electrical energy accumulator" do not have to include accumulators of different kinds. The "first electrical energy accumulator" and the "second electrical energy accumulator" may include accumulators of the same kind.

In the forgoing example embodiments, the starter generator 17 that also serves as the electric motor is adopted as the "generator". However, this is non-limiting. An alternator may be adopted as the "generator". In addition, in the forgoing example embodiments, the main controller 70 includes the abnormality determination unit 75, the ISG control unit 71, the idling control unit 73, and the driving control unit 74, but this is non-limiting. For example, the abnormality determination unit 75, the ISG control unit 71, the idling control unit 73, or the driving control unit 74, or any combination thereof may be provided in other controllers, or alternatively, the abnormality determination unit 75, the ISG control unit 71, the idling control unit 73, and the driving control unit 74 may be distributed over a plurality of controllers.

The main controller 70, the abnormality determination unit 75, the ISG control unit 71, the switch control unit 72, the idling control unit 73, and the driving control unit 74 illustrated in FIGS. 1 and 3 are implementable by circuitry including at least one semiconductor integrated circuit such as at least one processor (e.g., a central processing unit (CPU)), at least one application specific integrated circuit (ASIC), and/or at least one field programmable gate array (FPGA). At least one processor is configurable, by reading instructions from at least one machine readable non-transitory tangible medium, to perform all or a part of functions of the main controller 70, the abnormality determination unit 75, the ISG control unit 71, the switch control unit 72, the idling control unit 73, and the driving control unit 74. Such a medium may take many forms, including, but not limited to, any type of magnetic medium such as a hard disk, any type of optical medium such as a CD and a DVD, any type of semiconductor memory (i.e., semiconductor circuit) such as a volatile memory and a non-volatile memory. The volatile memory may include a DRAM and a SRAM, and the nonvolatile memory may include a ROM and a NVRAM. The ASIC is an integrated circuit (IC) customized to perform, and the FPGA is an integrated circuit designed to be configured after manufacturing in order to perform, all or a part of the functions of the main controller 70, the abnormality determination unit 75, the ISG control unit 71, the switch control unit 72, the idling control unit 73, and the driving control unit 74 illustrated in FIGS. 1 and 3.

It should be appreciated that modifications and alterations may be made by persons skilled in the art without departing from the scope as defined by the appended claims. The use of the terms first, second, etc. does not denote any order or importance, but rather the terms first, second, etc. are used to distinguish one element from another. The technology is intended to include such modifications and alterations in so far as they fall within the scope of the appended claims or the equivalents thereof.

The invention claimed is:

1. A vehicle power supply apparatus to be mounted on a vehicle that includes an engine, the vehicle power supply apparatus comprising:
a first power supply system including a generator and a first electrical energy accumulator, the generator being coupled to the engine, and the first electrical energy accumulator being able to be coupled to the generator;
a second power supply system including a second electrical energy accumulator and a group of electric devices, the second electrical energy accumulator being coupled in parallel to the first electrical energy accumulator, and the group of the electric devices being coupled to the second electrical energy accumulator;
an accumulator sensor configured to detect at least a discharge current of the second electrical energy accumulator; and
an abnormality determination unit configured to determine that the second electrical energy accumulator is abnormal on a condition that the accumulator sensor is normal and the discharge current of the second electrical energy accumulator is equal to or smaller than a current threshold,
wherein the current threshold is set at a smaller value than a value of a current to be discharged from the second electrical energy accumulator, with the group of the electric devices stopped.

2. The vehicle power supply apparatus according to claim 1, further comprising a switch configured to be controlled to a turn-on state and a turn-off state, the turn-on state including coupling the first power supply system and the second power supply system to each other, and the turn-off state including isolating the first power supply system and the second power supply system from each other, wherein
the abnormality determination unit determines whether or not the second electrical energy accumulator is abnormal, with the switch controlled to the turn-on state.

3. The vehicle power supply apparatus according to claim 1, further comprising a power generation controller configured to raise a power generation voltage of the generator to a greater value than a terminal voltage of the first electrical energy accumulator on a condition that a state of charge of the first electrical energy accumulator is lower than a power generation threshold, wherein
the power generation threshold is set at a first power generation threshold on a condition that the second electrical energy accumulator is normal, and is set at a second power generation threshold greater than the first power generation threshold on a condition that the second electrical energy accumulator is abnormal.

4. The vehicle power supply apparatus according to claim 3, further comprising:
a switch configured to be controlled to a turn-on state and a turn-off state, the turn-on state including coupling the first power supply system and the second power supply system to each other, and the turn-off state including isolating the first power supply system and the second power supply system from each other,
wherein the power generation controller is configured to lower the power generation voltage of the generator to a lower value than the terminal voltage of the first electrical energy accumulator on a condition that the state of charge of the first electrical energy accumulator is greater than a first suspension threshold that is greater than the first power generation threshold,
wherein when the second electrical energy accumulator is abnormal, (1) the switch maintains the turn-on state, (2) the power generation threshold is set to the second power generation threshold that is greater than the first power generation threshold, and (3) the first suspension threshold is changed to a second suspension threshold that is greater than the second power generation threshold.

5. The vehicle power supply apparatus according to claim 4, wherein the current threshold is set at a smaller value than a value of a current to be discharged from the second electrical energy accumulator, with the group of the electric devices stopped.

6. The vehicle power supply apparatus according to claim 4, wherein the current threshold is 100 mA.

7. The vehicle power supply apparatus according to claim 1, further comprising a power generation controller configured to lower a power generation voltage of the generator to a lower value than a terminal voltage of the first electrical energy accumulator, to control the generator to a power generation suspended state, on a condition that a state of charge of the first electrical energy accumulator is greater than a suspension threshold, wherein
the power generation controller controls the generator to the power generation suspended state on a basis of the state of charge of the first electrical energy accumulator on a condition that the second electrical energy accumulator is normal, and inhibits the power generation suspended state of the generator on a condition that the second electrical energy accumulator is abnormal.

8. The vehicle power supply apparatus according to claim 1, further comprising an assistance controller, wherein
the generator is a generator motor,
the assistance controller controls the generator motor to a powering state, to execute an assistance control, the assistance control including providing assistance to the engine, and
the assistance controller inhibits the assistance control on a condition that the second electrical energy accumulator is abnormal.

9. The vehicle power supply apparatus according to claim 1, further comprising an idling controller configured to execute an idling stop control, the idling stop control including stopping the engine on a condition that a stop condition is satisfied, wherein
the idling controller inhibits the idling stop control on a condition that the second electrical energy accumulator is abnormal.

10. The vehicle power supply apparatus according to claim 1, further comprising a driving controller configured to execute an automated driving control of the vehicle, wherein
the driving controller inhibits the automated driving control on a condition that the second electrical energy accumulator is abnormal.

11. A vehicle power supply apparatus to be mounted on a vehicle that includes an engine, the vehicle power supply apparatus comprising:
a first power supply system including a generator and a first electrical energy accumulator, the generator being coupled to the engine, and the first electrical energy accumulator being able to be coupled to the generator;
a second power supply system including a second electrical energy accumulator and a group of electric devices, the second electrical energy accumulator being coupled in parallel to the first electrical energy accumulator, and the group of the electric devices being coupled to the second electrical energy accumulator;
an accumulator sensor configured to detect at least a discharge current of the second electrical energy accumulator; and
circuitry configured to determine that the second electrical energy accumulator is abnormal on a condition that the accumulator sensor is normal and the discharge current of the second electrical energy accumulator is equal to or smaller than a current threshold
wherein the current threshold is set at a smaller value than a value of a current to be discharged from the second electrical energy accumulator, with the group of the electric devices stopped.

12. The vehicle power supply apparatus according to claim 11, further comprising a switch configured to be controlled to a turn-on state and a turn-off state, the turn-on state including coupling the first power supply system and the second power supply system to each other, and the turn-off state including isolating the first power supply system and the second power supply system from each other, wherein
the circuitry determines whether or not the second electrical energy accumulator is abnormal, with the switch controlled to the turn-on state.

13. The vehicle power supply apparatus according to claim 11,
wherein the circuitry is further configured to raise a power generation voltage of the generator to a greater value than a terminal voltage of the first electrical energy accumulator on a condition that a state of charge of the first electrical energy accumulator is lower than a power generation threshold, and
wherein the power generation threshold is set at a first power generation threshold on a condition that the second electrical energy accumulator is normal, and is set at a second power generation threshold greater than the first power generation threshold on a condition that the second electrical energy accumulator is abnormal.

14. The vehicle power supply apparatus according to claim 11,
wherein the circuitry is further configured to lower a power generation voltage of the generator to a lower value than a terminal voltage of the first electrical energy accumulator, to control the generator to a power generation suspended state, on a condition that a state of charge of the first electrical energy accumulator is greater than a suspension threshold, and
wherein the circuitry is configured to control the generator to the power generation suspended state on a basis of the state of charge of the first electrical energy accumulator on a condition that the second electrical energy accumulator is normal, and inhibits the power generation suspended state of the generator on a condition that the second electrical energy accumulator is abnormal.

15. The vehicle power supply apparatus according to claim 11,
wherein the generator is a generator motor,
wherein the circuitry is configured to control the generator motor to a powering state, to execute an assistance control, the assistance control including providing assistance to the engine, and
wherein the circuitry is configured to inhibit the assistance control on a condition that the second electrical energy accumulator is abnormal.

16. The vehicle power supply apparatus according to claim 11,
wherein the circuitry is configured to execute an idling stop control, the idling stop control including stopping the engine on a condition that a stop condition is satisfied, and
wherein the circuitry is configured to inhibit the idling stop control on a condition that the second electrical energy accumulator is abnormal.

17. The vehicle power supply apparatus according to claim 11,
wherein the circuitry is configured to execute an automated driving control of the vehicle, and
wherein the circuitry is configured to inhibit the automated driving control on a condition that the second electrical energy accumulator is abnormal.

* * * * *